US008680695B2

(12) United States Patent
Huffman et al.

(10) Patent No.: US 8,680,695 B2
(45) Date of Patent: Mar. 25, 2014

(54) ENERGY HARVESTING USING MEMS COMPOSITE TRANSDUCER

(75) Inventors: James D. Huffman, Pittsford, NY (US); Gary A. Kneezel, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 376 days.

(21) Appl. No.: 13/089,500

(22) Filed: Apr. 19, 2011

(65) Prior Publication Data
US 2012/0267899 A1 Oct. 25, 2012

(51) Int. Cl.
F03D 5/04 (2006.01)
G01L 3/10 (2006.01)

(52) U.S. Cl.
USPC .............................................. 290/1 R; 322/3

(58) Field of Classification Search
USPC .................. 290/1 R, 1 A; 322/3, 37
See application file for complete search history.

(56) References Cited

U.S. PATENT DOCUMENTS

| | | | |
|---|---|---|---|
| 6,474,787 B1 | 11/2002 | Cruz-Uribe | |
| 7,112,911 B2 * | 9/2006 | Tanaka et al. | 310/309 |
| 7,245,062 B2 * | 7/2007 | Schmidt | 310/330 |
| 7,256,505 B2 * | 8/2007 | Arms et al. | 290/1 R |
| 7,571,992 B2 | 8/2009 | Jia et al. | |
| 8,030,807 B2 * | 10/2011 | Gieras et al. | 310/25 |
| 8,222,754 B1 * | 7/2012 | Soliman et al. | 290/1 R |
| 8,222,775 B2 * | 7/2012 | Gieras et al. | 310/25 |
| 8,476,778 B2 * | 7/2013 | Weinberger et al. | 290/42 |
| 2009/0315335 A1 * | 12/2009 | Ujihara et al. | 290/1 R |
| 2010/0148519 A1 * | 6/2010 | Shih et al. | 290/1 R |
| 2010/0308592 A1 * | 12/2010 | Frayne | 290/54 |
| 2011/0215590 A1 * | 9/2011 | Arnold et al. | 290/1 R |
| 2011/0285131 A1 * | 11/2011 | Kwon et al. | 290/50 |
| 2012/0250456 A1 * | 10/2012 | Tenghamn | 367/20 |
| 2012/0267900 A1 * | 10/2012 | Huffman et al. | 290/1 R |
| 2012/0268513 A1 * | 10/2012 | Huffman et al. | 347/11 |
| 2012/0268525 A1 * | 10/2012 | Baumer et al. | 347/54 |
| 2012/0268526 A1 * | 10/2012 | Huffman et al. | 347/54 |
| 2012/0268529 A1 * | 10/2012 | Baumer et al. | 347/54 |

* cited by examiner

Primary Examiner — Nicholas Ponomarenko
(74) Attorney, Agent, or Firm — William R. Zimmerli

(57) ABSTRACT

A method of harvesting energy from the environment includes providing an energy harvesting device. The energy harvesting device includes a MEMS composite transducer. The MEMS composite transducer includes a substrate. Portions of the substrate define an outer boundary of a cavity. A MEMS transducing member includes a beam having a first end and a second end. The first end is anchored to the substrate and the second end cantilevers over the cavity. A compliant membrane is positioned in contact with the MEMS transducing member. A first portion of the compliant membrane covers the MEMS transducing member. A second portion of the compliant membrane is anchored to the substrate. The energy harvesting device is configured so that the compliant membrane is set into oscillation by excitations produced external to the energy harvesting device. The MEMS transducing member is caused to move into and out of the cavity by the oscillating compliant membrane. The motion of the MEMS transducing member is converted into an electrical signal.

14 Claims, 12 Drawing Sheets

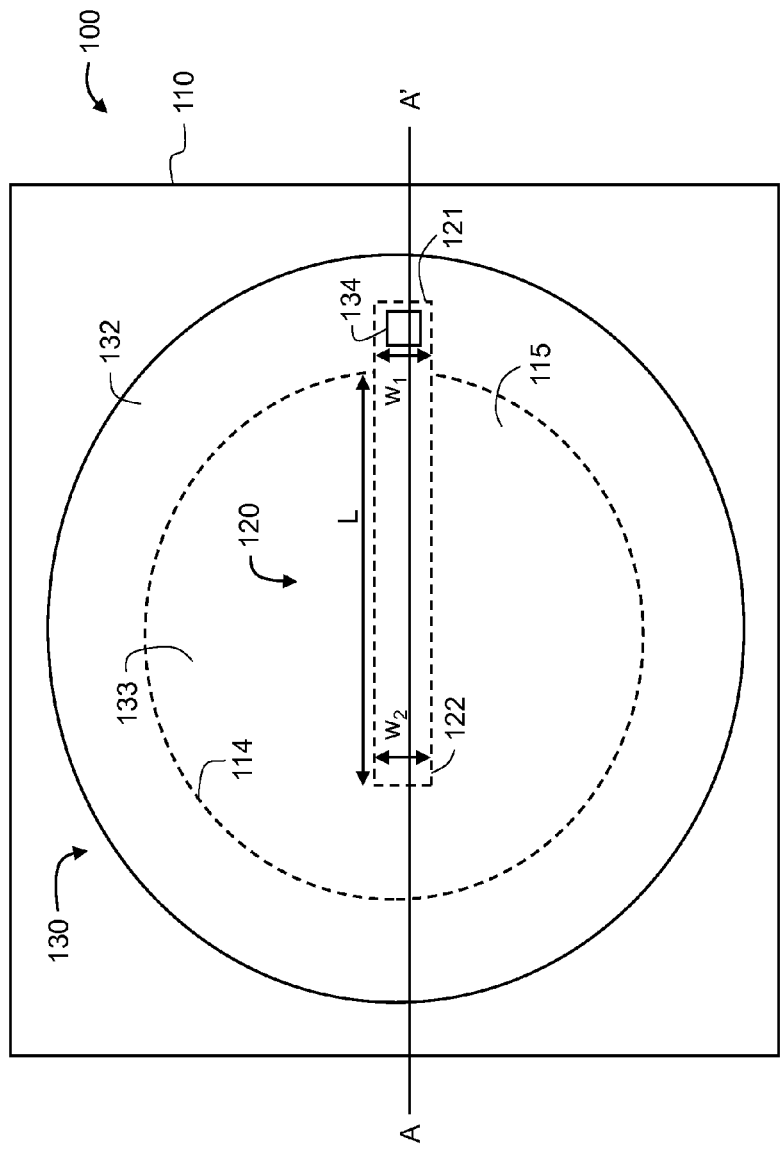
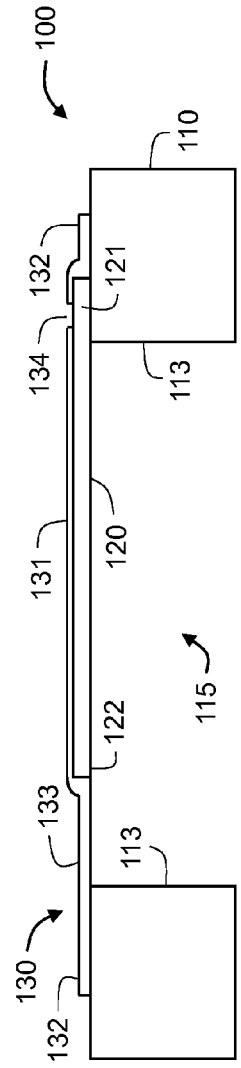
FIG. 1A
FIG. 1B

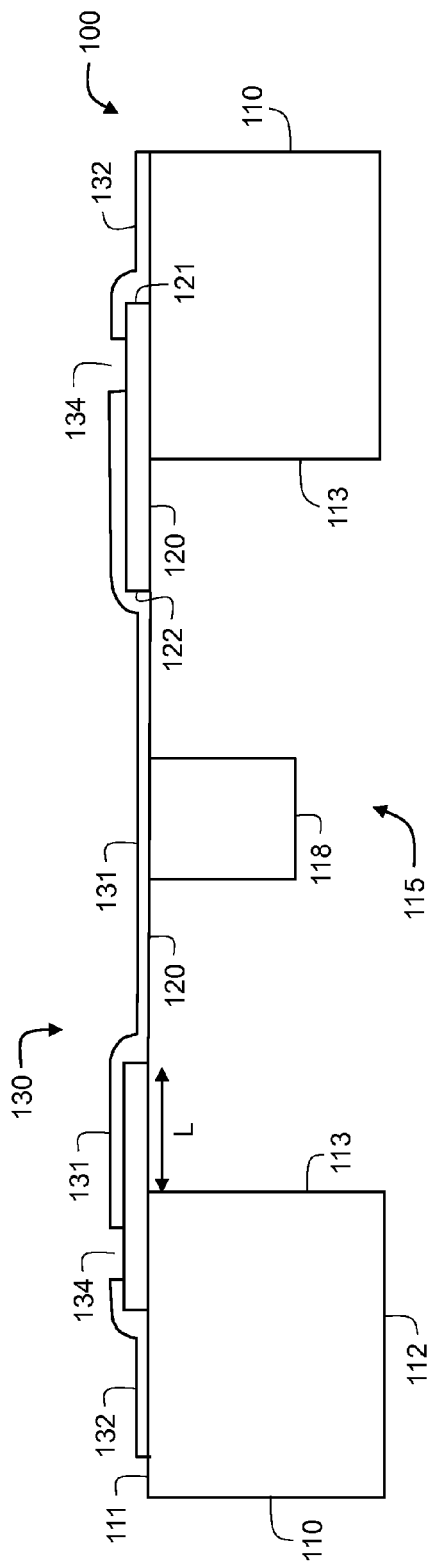
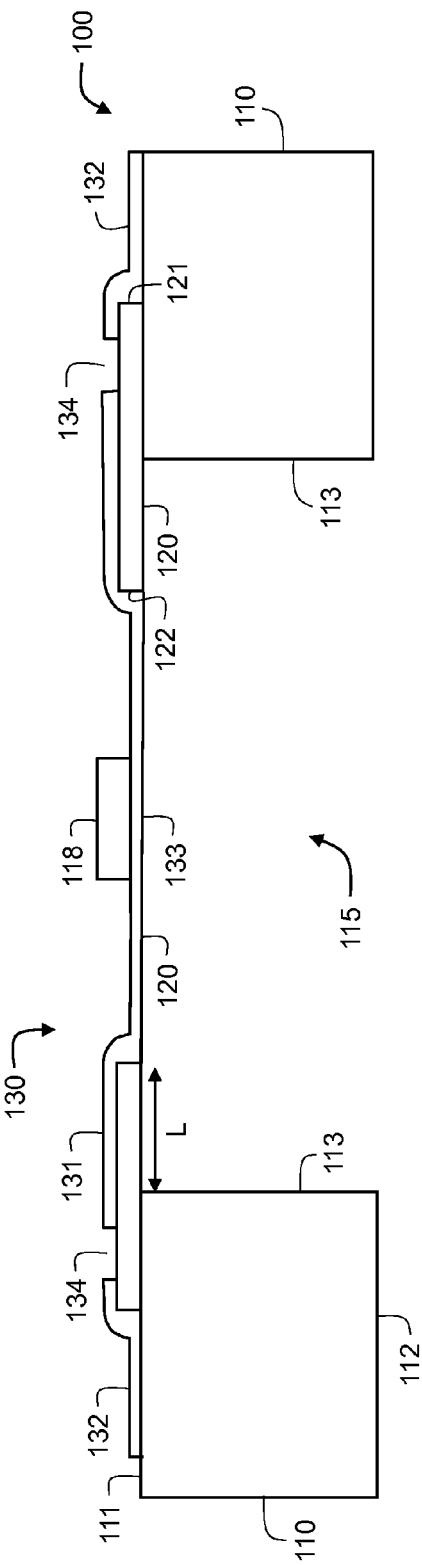
FIG. 6A
FIG. 6B

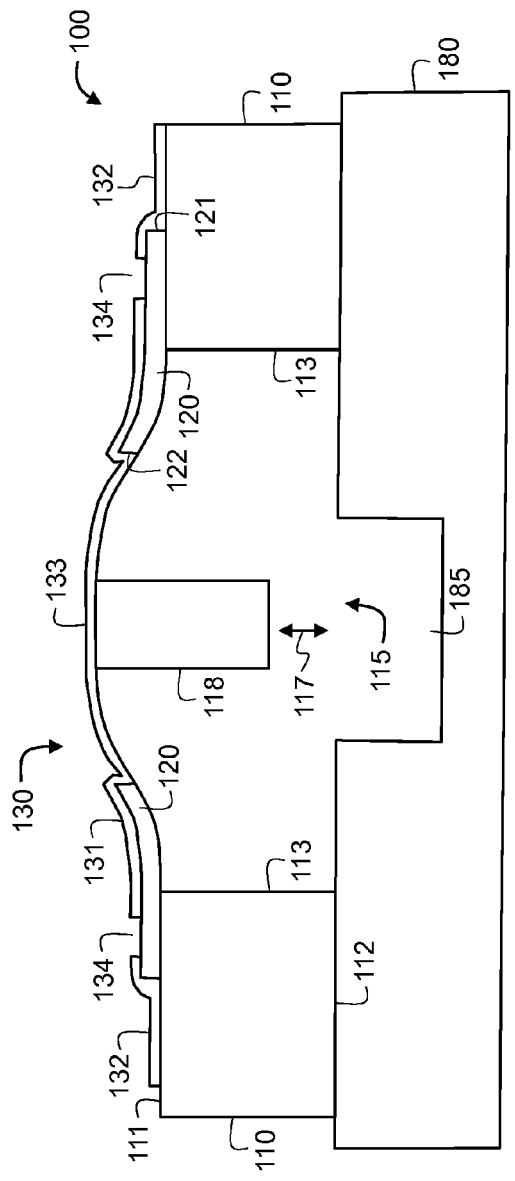
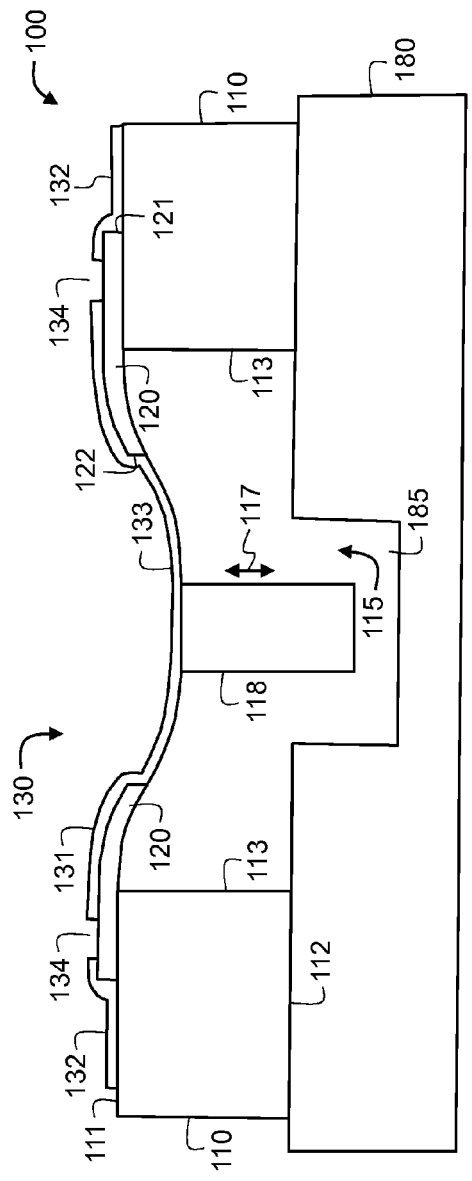
FIG. 7A
FIG. 7B

ENERGY HARVESTING USING MEMS COMPOSITE TRANSDUCER

CROSS REFERENCE TO RELATED APPLICATIONS

Reference is made to commonly-assigned, U.S. patent applications Ser. No. 13/089,541, entitled "MEMS COMPOSITE TRANSDUCER INCLUDING COMPLIANT MEMBRANE", Ser. No. 13/089,532, entitled "FABRICATING MEMS COMPOSITE TRANSDUCER INCLUDING COMPLIANT MEMBRANE", Ser. No. 13/089,507, entitled "ENERGY HARVESTING DEVICE INCLUDING MEMS COMPOSITE TRANSDUCER", all filed concurrently herewith.

FIELD OF THE INVENTION

This invention relates generally to energy harvesting devices, and in particular to a MEMS-based transducer that converts motion into electrical energy.

BACKGROUND OF THE INVENTION

Micro-Electro-Mechanical Systems (or MEMS) devices are becoming increasingly prevalent as low-cost, compact devices having a wide range of applications. Uses include pressure sensors, accelerometers, gyroscopes, microphones, digital mirror displays, microfluidic devices, biosensors, chemical sensors, and others.

MEMS transducers include both actuators and sensors. In other words they typically convert an electrical signal into a motion, or they convert a motion into an electrical signal. They are typically made using standard thin film and semiconductor processing methods. As new designs, methods and materials are developed, the range of usages and capabilities of MEMS devices can be extended.

MEMS transducers are typically characterized as being anchored to a substrate and extending over a cavity in the substrate. Three general types of such transducers include a) a cantilevered beam having a first end anchored and a second end cantilevered over the cavity; b) a doubly anchored beam having both ends anchored to the substrate on opposite sides of the cavity; and c) a clamped sheet that is anchored around the periphery of the cavity. Type c) is more commonly called a clamped membrane, but the word membrane will be used in a different sense herein, so the term clamped sheet is used to avoid confusion.

Sensors and actuators can be used to sense or provide a displacement or a vibration. For example, the amount of deflection δ of the end of a cantilever in response to a stress cy is given by Stoney's formula $$\delta = 3\sigma(1-v)L^2/ET^2 \qquad (1),$$

where v is Poisson's ratio, E is Young's modulus, L is the beam length, and t is the thickness of the cantilevered beam. In order to increase the amount of deflection for a cantilevered beam, one can use a longer beam length, a smaller thickness, a higher stress, a lower Poisson's ratio, or a lower Young's modulus. The resonant frequency of vibration of an undamped cantilevered beam is given by $$f = \omega_0/2\pi = (k/m)^{1/2}/2\pi, \qquad (2),$$

where k is the spring constant and m is the mass. For a cantilevered beam of constant width w, the spring constant k is given by $$k = Ewt^3/4L^3 \qquad (3).$$

It can be shown that the dynamic mass m of an oscillating cantilevered beam is approximately one quarter of the actual mass of pwtL (ρ being the density of the beam material), so that within a few percent, the resonant frequency of vibration of an undamped cantilevered beam is approximately $$f \sim (t/2\pi L^2)(E/\rho)^{1/2} \qquad (4).$$

For a lower resonant frequency one can use a smaller Young's modulus, a smaller thickness, a longer length, or a larger density. A doubly anchored beam typically has a lower amount of deflection and a higher resonant frequency than a cantilevered beam having comparable geometry and materials. A clamped sheet typically has an even lower amount of deflection and an even higher resonant frequency.

Based on material properties and geometries commonly used for MEMS transducers the amount of deflection can be limited, as can the frequency range, so that some types of desired usages are either not available or do not operate with a preferred degree of energy efficiency, spatial compactness, or reliability. For example, using typical thin film transducer materials for an undamped cantilevered beam of constant width, Equation 4 indicates that a resonant frequency of several megahertz is obtained for a beam having a thickness of 1 to 2 microns and a length of around 20 microns. However, to obtain a resonant frequency of 1 kHz for a beam thickness of about 1 micron, a length of around 750 microns would be required. Not only is this undesirably large, a beam of this length and thickness can be somewhat fragile. In addition, typical MEMS transducers operate independently. For some applications independent operation of MEMS transducers is not able to provide the range of performance desired.

Energy harvesting devices convert ambient energy from the environment into electrical energy. An example is a piezoelectric energy harvesting device that converts mechanical strain into electric current or voltage. Typically, these devices operate most efficiently when oscillating at mechanical resonance. However, many of the prevalent frequencies of motion in the environment tend to be in the low kilohertz range (including pressure waves and mechanical vibrations) down to 100 Hz and below (such as vibration from a motor powered at 60 Hz). As discussed above, a piezoelectric cantilevered beam having a resonant frequency in this range can be undesirably large and fragile.

Accordingly, there is a need for a MEMS transducer design and method of operation that provides low cost, compact, or reliable energy harvesting devices capable of efficiently converting externally produced excitations to electrical energy especially when the excitations are in a frequency range that is below a few kilohertz.

SUMMARY OF THE INVENTION

According to an aspect of the invention, a method of harvesting energy from the environment includes providing an energy harvesting device. The energy harvesting device includes a MEMS composite transducer. The MEMS composite transducer includes a substrate. Portions of the substrate define an outer boundary of a cavity. A MEMS transducing member includes a beam having a first end and a second end. The first end is anchored to the substrate and the second end cantilevers over the cavity. A compliant membrane is positioned in contact with the MEMS transducing member. A first portion of the compliant membrane covers the MEMS transducing member. A second portion of the compliant membrane is anchored to the substrate. The energy harvesting device is configured so that the compliant membrane is set into oscillation by excitations produced external to the energy harvesting device. The MEMS transducing member is caused to move into and out of the cavity by the oscillating compliant membrane. The motion of the MEMS transducing member is converted into an electrical signal.

BRIEF DESCRIPTION OF THE DRAWINGS

In the detailed description of the example embodiments of the invention presented below, reference is made to the accompanying drawings, in which:

FIG. 1A is a top view and FIG. 1B is a cross-sectional view of an configuration of a MEMS composite transducer including a cantilevered beam and a compliant membrane over a cavity;

FIGS. 6A and 6B are cross-sectional views similar to FIG. 4A, but where a mass is affixed to the compliant membrane;

FIG. 7A is a cross-sectional view of the MEMS composite transducer having an affixed mass in its undeflected state;

FIG. 7B is a cross-sectional view of the MEMS composite transducer having an affixed mass in its deflected state;

DETAILED DESCRIPTION OF THE INVENTION

Figure 2:
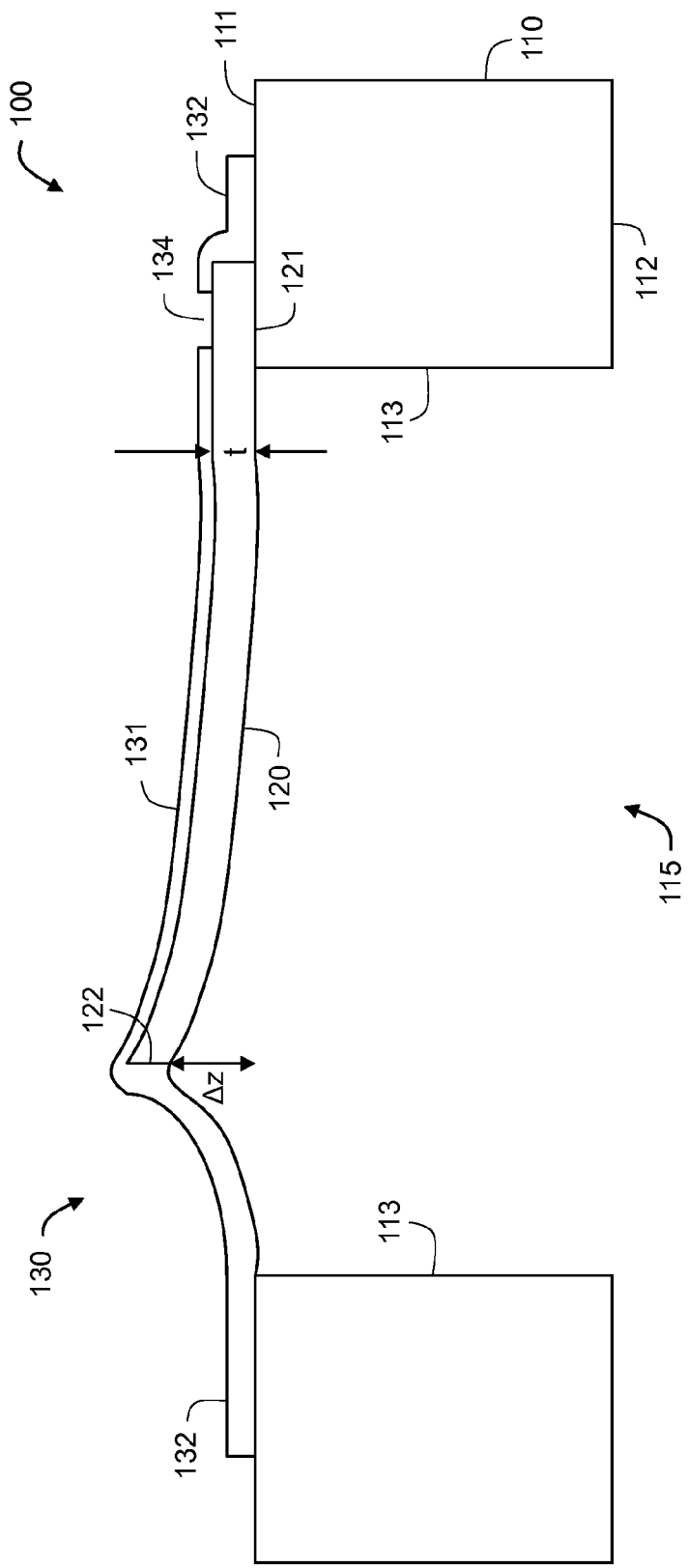
FIG. 2 is a cross-sectional view similar to FIG. 1B, where the cantilevered beam is deflected.

The present description will be directed in particular to elements forming part of, or cooperating more directly with, apparatus in accordance with the present invention. It is to be understood that elements not specifically shown or described may take various forms well known to those skilled in the art.

Embodiments of the present invention include a variety of types of MEMS transducers including a MEMS transducing member and a compliant membrane positioned in contact with the MEMS transducing member, configured such that the MEMS composite transducer can be set into oscillation by excitations such as vibrations or pressure waves in gases, liquids, or solids, in order to convert such periodic excitation into electrical energy. The vibrations can be transmitted to the MEMS composite transducer through, for example, direct or indirect mechanical contact with a vibrating body, or through sound wave propagation. It is to be noted that in some definitions of MEMS structures, MEMS components are specified to be between 1 micron and 100 microns in size. Although such dimensions characterize a number of embodiments, it is contemplated that some embodiments will include dimensions outside that range.

Some general characteristics of a MEMS composite transducer will be explained prior to describing embodiments of the present invention that include a MEMS composite transducer configured as part of an energy harvesting device. FIG. 1A shows a top view and FIG. 1B shows a cross-sectional view (along A-A') of a first configuration of a MEMS composite transducer 100, where the MEMS transducing member is a cantilevered beam 120 that is anchored at a first end 121 to a first surface 111 of a substrate 110. Portions 113 of the substrate 110 define an outer boundary 114 of a cavity 115. In the example of FIGS. 1A and 1B, the cavity 115 is substantially cylindrical and is a through hole that extends from a first surface 111 of substrate 110 (to which a portion of the MEMS transducing member is anchored) to a second surface 112 that is opposite first surface 111. Other shapes of cavity 115 are contemplated for other configurations (not shown) in which the cavity 115 does not extend all the way to the second surface 112. Still other embodiments are contemplated where the cavity shape is not cylindrical with circular symmetry. A portion of cantilevered beam 120 extends over a portion of cavity 115 and terminates at second end 122. The length L of the cantilevered beam extends from the anchored end 121 to the free end 122. Cantilevered beam 120 has a width $w_1$ at first end 121 and a width $w_2$ at second end 122. In the example of FIGS. 1A and 1B, $w_1=w_2$, but in some embodiments that need not be the case. MEMS transducers having an anchored beam cantilevering over a cavity are well known. A feature that distinguishes the MEMS composite transducer 100 from a conventional device is a compliant membrane 130 that is positioned in contact with the cantilevered beam 120 (one example of a MEMS transducing member). Compliant membrane includes a first portion 131 that covers the MEMS transducing member, a second portion 132 that is anchored to first surface 111 of substrate 110, and a third portion 133 that overhangs cavity 115 while not contacting the MEMS transducing member. In a fourth region 134, compliant membrane 130 is removed such that it does not cover a portion of the MEMS transducing member near the first end 121 of cantilevered beam 120, so that electrical contact can be made as is discussed in further detail below. In the example shown in FIG. 1B, second portion 132 of compliant membrane 130 that is anchored to substrate 110 is anchored around the outer boundary 114 of cavity 115. In other embodiments (not shown), it is contemplated that the second portion 132 would not extend entirely around outer boundary 114.

The portion (including end 122) of the cantilevered beam 120 that extends over at least a portion of cavity 115 is free to move relative to cavity 115.

A common type of motion for a cantilevered beam is shown in FIG. 2, which is similar to the view of FIG. 1B at higher magnification, but with the cantilevered portion of cantilevered beam 120 deflected upward away by a deflection $\delta=\Delta z$ from the original undeflected position shown in FIG. 1B (the z direction being perpendicular to the x-y plane of the surface 111 of substrate 110). Such a bending motion is provided for example in an actuating mode by a MEMS transducing material (such as a piezoelectric material, or a shape memory alloy, or a thermal bimorph material) that expands or contracts relative to a reference material layer to which it is affixed when an electrical signal is applied, as is discussed in further detail below. When the upward deflection out of the cavity is released (by stopping the electrical signal), the MEMS transducer typically moves from being out of the cavity to into the cavity before it relaxes to its undeflected position. Some types of MEMS transducers have the capability of being driven both into and out of the cavity, and are also freely movable into and out of the cavity.

Desirable properties of compliant membrane 130 are that it have a Young's modulus that is much less than the Young's modulus of typical MEMS transducing materials, that it have a relatively large elongation before breakage, and that it have excellent chemical resistance (for compatibility with MEMS manufacturing processes). Some polymers, including some epoxies, are well adapted to be used as a compliant membrane 130. Examples include TMMR liquid resist or TMMF dry film, both being products of Tokyo Ohka Kogyo Co. The Young's modulus of cured TMMR or TMMF is about 2 GPa, as compared to approximately 70 GPa for a silicon oxide, around 100 GPa for a PZT piezoelectric, around 160 GPa for a platinum metal electrode, and around 300 GPa for silicon nitride. Thus the Young's modulus of the typical MEMS transducing member is at least a factor of 10 greater, and more typically more than a factor of 30 greater than that of the compliant membrane 130. A benefit of a low Young's modulus of the compliant membrane is that this type of design allows for the compliant membrane to have negligible effect on the amount of deflection for the portion 131 of the compliant membrane that covers the MEMS transducing member, but is readily deflected in the portion 133 of compliant membrane 130 that is nearby the MEMS transducing member but not directly contacted by the MEMS transducing member. In addition, the elongation before breaking of cured TMMR or TMMF is around 5%, so that it is capable of large deflection without damage. Furthermore, because the Young's modulus of the compliant membrane 130 is much less than that of the typical MEMS transducing member, it has little effect on the resonant frequency of the MEMS composite transducer 100 if the MEMS transducing member (for example, cantilevered beam 120) and the compliant membrane 130 have comparable size. However, if the MEMS transducing member is significantly smaller than the compliant membrane 130, the resonant frequency of the MEMS composite transducer can be significantly lowered.

Providing a lower resonant frequency MEMS composite transducer is a feature that can be particularly beneficial in an energy harvesting device. As mentioned above, piezoelectric energy harvesting devices convert mechanical strain into electric current or voltage. Typically such devices operate most efficiently when oscillating at mechanical resonance. However, many of the prevalent frequencies of motion in the environment tend to be in the low kilohertz range (including sound waves, other pressure waves and mechanical vibrations) down to 100 Hz and below (such as vibration from a motor powered at 60 Hz). To obtain a resonant frequency of 1 kHz or lower for a piezoelectric cantilevered beam thickness of about 1 micron, a beam length of around 750 microns or longer would be required. Not only is this undesirably large, a beam of this length and thickness can be somewhat fragile.

Figure 3:
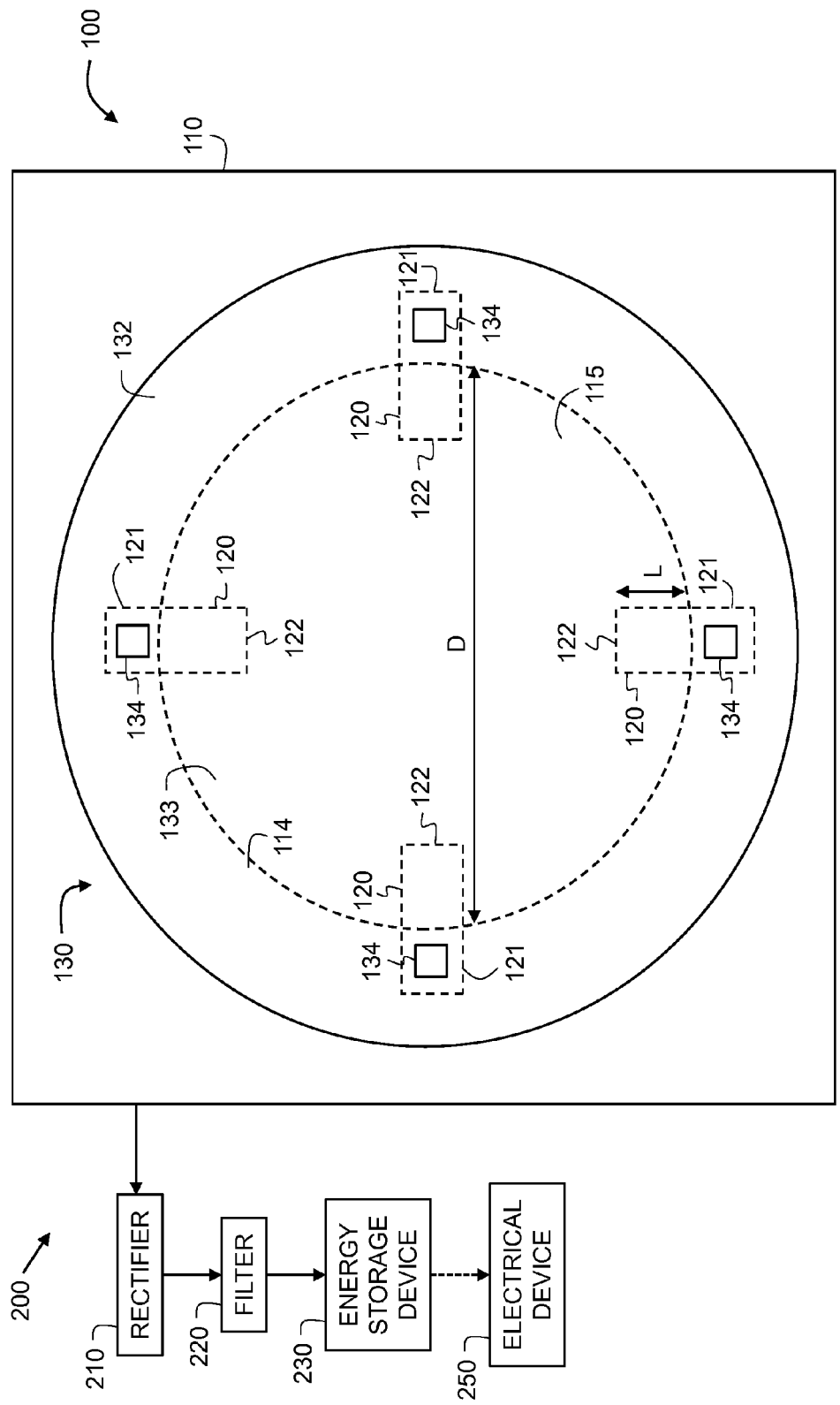
FIG. 3 is a top view of an embodiment of an energy harvesting device including a MEMS composite transducer and associate circuitry.

Referring to FIGS. 3-11B, example embodiments of MEMS composite transducers 100 suitable for use in an energy harvesting device are shown. This includes different configurations within the family of MEMS composite transducers 100 having one or more cantilevered beams 120 as the MEMS transducing member covered by the compliant membrane 130. The different embodiments within this family have different amounts of displacement or different resonant frequencies or different amounts of coupling between multiple cantilevered beams 120 extending over a portion of cavity 115, and thereby are well suited to a variety of applications. For an energy harvesting device, cantilevered beams 120 having a length that is small in comparison with a dimension across the cavity can be advantageous, in that the compliant membrane 130 can be set into oscillation at a lower resonant frequency, thereby causing deflection of the cantilevered beams 120. FIG. 3 shows a portion of an energy harvesting device 200 including a MEMS composite transducer 100 having four cantilevered beams 120 as the MEMS transducing members, each cantilevered beam 120 including a first end that is anchored to substrate 110, and a second end 122 that is cantilevered over cavity 115. In the embodiment of FIG. 3, the length L of the cantilevered beams 120 (the distances from anchored first ends 121 to free second ends 122) are less than 20% of the dimension D across cavity 115. In this particular example, where the outer boundary 114 of cavity 115 is circular, D is the diameter of the cavity 115. In this example, the widths $w_1$ (see FIG. 1A) of the first ends 121 of the cantilevered beams 120 are all substantially equal to each other, and the widths $w_2$ (see FIG. 1A) of the second ends 122 of the cantilevered beams 120 are all substantially equal to each other. In addition, $w_1=w_2$ in the example of FIG. 3. Compliant membrane 130 includes first portions 131 that cover the cantilevered beams 120 (as seen more clearly in the cross-sectional view through two cantilevered beams 120 in FIG. 4A), a second portion 132 that is anchored to substrate 110, and a third portion 133 that overhangs cavity 115 while not contacting the cantilevered beams 120. Portions 134 of the compliant membrane are removed provide access to electrical contacts to the cantilevered beams 120.

Figure 4A:
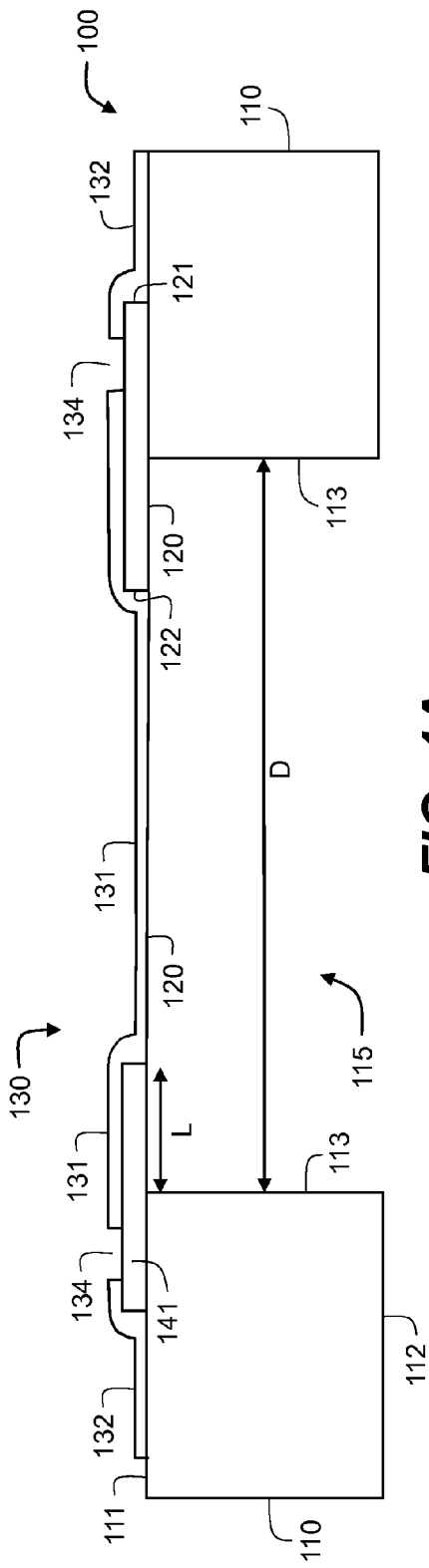
FIG. 4A is a cross-sectional view of the MEMS composite transducer of FIG. 3 in its undeflected state.
Figure 4B:
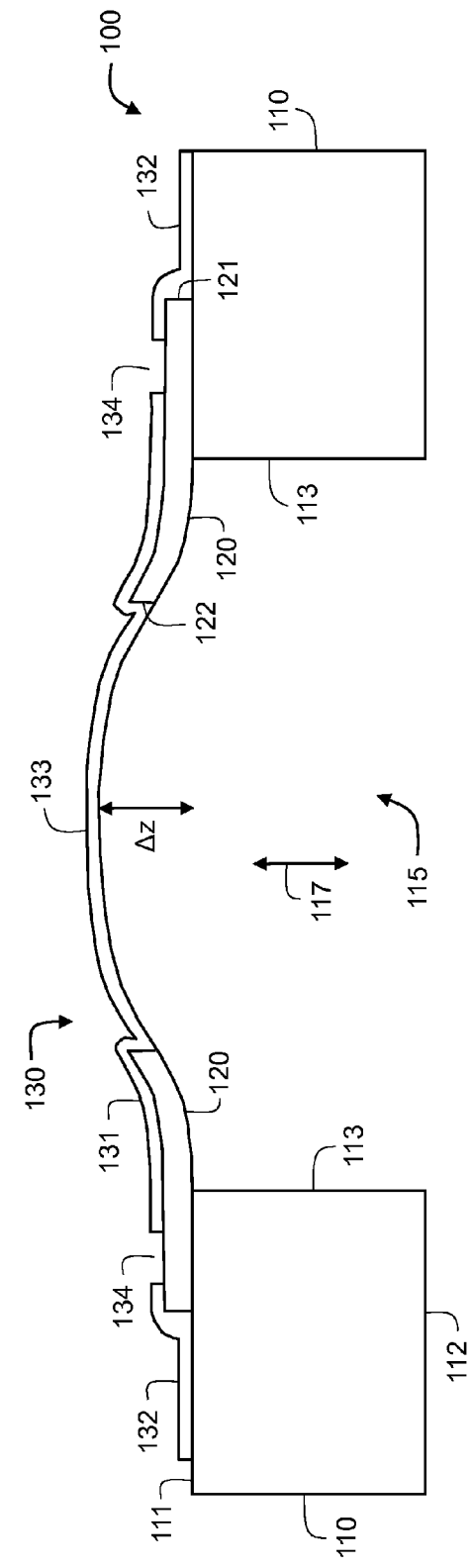
FIG. 4B is a cross-sectional view of the MEMS composite transducer of FIG. 3 in its deflected state.

FIG. 4A shows a cross-sectional view through two of the cantilevered beams 120 and compliant membrane 130 of FIG. 3 in an undeflected state. FIG. 4B shows a similar cross-sectional view, but where the compliant membrane 130 has been deflected (for example, set into oscillation by an external excitation). The amplitude of the deflection of compliant membrane 130 near the center of cavity 115 is $\delta=\Delta z$ along a direction that is parallel to axis 117 of cavity 115. The deflected compliant membrane 130, being in contact with the cantilevered beams 120, causes the cantilevered beams 120 also to deflect upward. When the oscillating compliant membrane 130 subsequently deflects downward into cavity 115, the cantilevered beams 120 are caused to deflect downward. Even a low frequency oscillation can cause a short MEMS transducing member having a high resonant frequency to deflect because of the coupling of motion from the compliant membrane 130 of the MEMS composite transducer 100. Without compliant membrane 130 coupling the oscillation to the cantilevered beams 120, cantilevered beams 120 are not deflected appreciably by the low frequency external excitation.

For a cantilevered beam 120 including a piezoelectric material, the alternating upward and downward deflection of compliant membrane 130 results in alternating compression and tension within the cantilevered beams 120, thereby generating an AC voltage. As illustrated in FIG. 3, the AC output of an energy harvesting device 200 is typically connected to a rectifier 210 to provide a DC voltage. The output of rectifier 210 is optionally smoothed by a filter 220, and is connected to an energy storage device 230, such as a capacitor or a battery. Optionally, a regulator (not shown) can be provided between the filter 220 and the energy storage device 230. Because the power output of a piezoelectric energy harvesting device is typically on the order of microwatts to milliwatts, it is typically well-suited for providing a trickle charge to energy storage device 230. Energy storage device 230 is used to power an electrical device 250. In some embodiments rectifier 210 is integrated onto the same substrate 110 as MEMS composite transducer 100, while in other embodiments rectifier 210 can be packaged as a hybrid circuit in the same microelectronic package as MEMS composite transducer 100. Similarly, in some embodiments, any or all of filter 220, energy storage device 230 and electrical device 250 can also be integrated onto the same substrate 110, or they can be packaged as a hybrid circuit, or they can be connected with wires. In some applications, it can be particularly desirable to package energy harvesting device 200, rectifier 210, filter 220, energy storage device 230 and electrical device 250 together in a single microelectronic package, so that no wiring harness is required for electrical connection. Energy harvesting device 200, rectifier 210, optional filter 220 (and optional regulator) and energy storage device 230 are together considered to be part of an energy harvesting apparatus. Electrical device 250 is shown connected to energy storage device 230 by a dashed line, because it is using energy, not harvesting energy, so it is not part of the energy harvesting apparatus, even though in some embodiments it can be integrated together within the same substrate.

Figure 5:
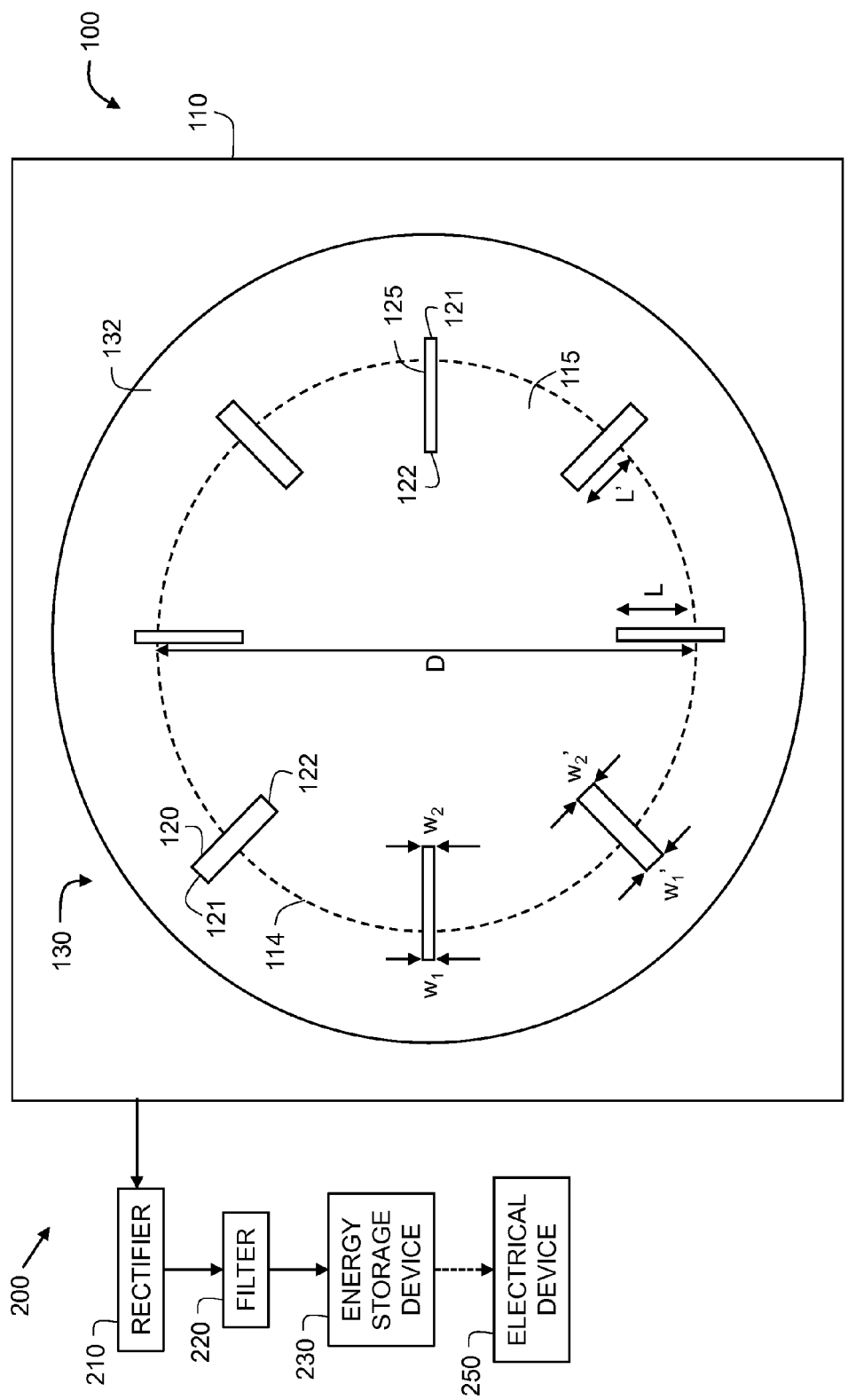
FIG. 5 is a top view of an embodiment of an energy harvesting device including a MEMS composite transducer and associate circuitry.

FIG. 5 shows an embodiment of an energy harvesting device 200 similar to FIG. 3 in which there are two groups of cantilevered beams 120 and 125, with the elements of the two groups being alternatingly arranged. In the embodiment of FIG. 5 the lengths L and L' of the cantilevered beams 120 and 125 respectively (the distances from anchored first ends 121 to free second ends 122) are less than 20% of the dimension D across cavity 115. In this particular example, where the outer boundary 114 of cavity 115 is circular, D is the diameter of the cavity 115. In addition, in the embodiment of FIG. 6, the lengths L and L' are different from each other, the first widths $w_1$ and $w_1'$ are different from each other, and the second widths $w_2$ and $W_2'$ are different from each other for the cantilevered beams 120 and 125. Such an embodiment can be beneficial if the groups of both geometries of cantilevered beams 120 and 125 are used to convert a motion of compliant membrane 130 to an electrical signal, and it is desired to pick up different amounts of deflection or at different frequencies. While the embodiment of FIG. 5 includes eight cantilevered beams 120 and 125, other embodiments (not shown) can include many more cantilevered beams.

In the embodiments shown in FIGS. 1A, 3 and 5, the cantilevered beams 120 (one example of the MEMS transducing members) are disposed with substantially radial symmetry around a circular cavity 115. This can be a preferred type of configuration in many embodiments, but other embodiments are contemplated having nonradial symmetry or noncircular cavities.

Some embodiments of MEMS composite transducer 100 for an energy harvesting device include an attached mass 118, as shown in FIGS. 6A and 6B, in order to further lower the resonant frequency. The mass 118 can be attached to the portion 133 of the compliant membrane 130 that overhangs cavity 115 but does not contact the MEMS transducing member, for example. In the embodiment shown in the cross-sectional view of FIG. 6A including a plurality of cantilevered beams 120 (such as the configurations shown in FIGS. 3 to 5), mass 118 extends below portion 133 of compliant membrane 130, so that it is located within the cavity 115. Alternatively, mass 118 can be affixed to the opposite side of the compliant membrane 130, as shown in FIG. 16B. The configuration of FIG. 6A can be particularly advantageous if a large mass is needed. For example, a portion of silicon substrate 110 can be left in place as mass 118 when cavity 115 is etched. In such a configuration, mass 118 would typically extend the full depth of the cavity 115. In order for the MEMS composite transducer to vibrate without crashing of mass 118, substrate 110 would typically be mounted on a mounting member 180 including a recess 185 below cavity 115 as shown in FIGS. 7A and 7B. FIG. 7A shows a cross-sectional view with compliant membrane 130 deflected upward along axis 117 of cavity 115, while FIG. 7B shows a similar cross-sectional view with compliant membrane 130 deflected downward along axis 117 into cavity 115, such that mass 118 extends within recess 185 of mounting member 180. For the configuration shown in FIG. 6B, the attached mass 118 can be formed by patterning an additional layer over the compliant membrane 130. In other embodiments there can be an attached mass 118 on both sides of the compliant membrane.

In some embodiments, for example, as shown in FIGS. 6A and 6B, mass 118 is disposed at or near the center of compliant membrane 118. Further, in some embodiments, mass 118 is disposed symmetrically about a center of compliant membrane 130. In such cases, the mass 118 can also be disposed at the center of compliant membrane 130, but in other embodiments the mass 118 is not disposed at the center of the compliant membrane. Different distributions of mass 118 attached to compliant membrane 130 can facilitate excitation of different vibrational modes having different resonant frequency.

Figure 8:
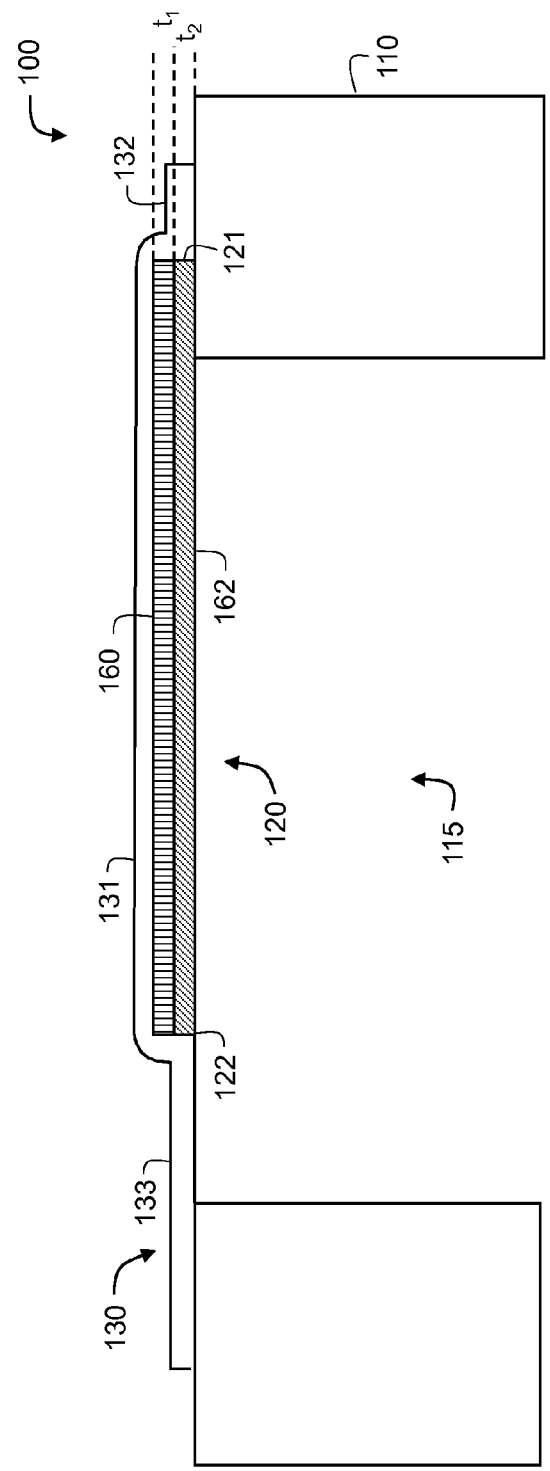
FIG. 8 is a cross-sectional view showing additional structural detail of a MEMS composite transducer including a cantilevered beam that can be used in an energy harvesting device.

A variety of transducing mechanisms and materials can be used in the MEMS composite transducer for the energy harvesting device of the present invention. In the examples described above, the MEMS transducing mechanisms include a deflection out of the plane of the undeflected MEMS composite transducer, for example, a bending motion. For a bending motion, it is advantageous in some embodiments to include in the MEMS transducing member a piezoelectric MEMS transducing material 160 in contact with a reference material 162, as shown for the cantilevered beam 120 in FIG. 8. In the example of FIG. 8, the MEMS transducing material 160 is shown on top of reference material 162, but alternatively the reference material 162 can be on top of the MEMS transducing material 160. Reference material 162 can include one or more insulator layers such as silicon oxide or silicon nitride, as well as one or more conductor layers to serve as electrodes. It is preferable to design the relative thicknesses $t_1$ and $t_2$ of the piezoelectric MEMS transducing material 160 and the reference material 162 such that the neutral axis (on either side of which stress and strain change sign) is not within the MEMS transducing material 160. In other words, it is desired for efficiency of conversion from strain to voltage in the piezoelectric material that when the cantilevered beam 120 is deflected upward, the piezoelectric MEMS transducing material either be completely in compression or completely in tension throughout the cantilevered beam 120. Similarly, when the cantilevered beam 120 is deflected downward, it is desired that the piezoelectric MEMS transducing material either be completely in tension or completely in compression throughout the cantilevered beam 120.

Piezoelectric materials are particularly advantageous for use in MEMS composite transducer for an energy harvesting device, because of their ability to convert a strain into an electrical signal. There are a variety of types of piezoelectric materials. A family of interest includes piezoelectric ceramics, such as lead zirconate titanate or PZT.

Because there can be a wide range of frequencies of mechanical vibration or pressure waves in the environment, it is advantageous to provide an energy harvesting device 200 that is effective in converting a wide range of frequencies of mechanical or pressure wave excitation into electrical energy. One way to broaden the frequency response is to add damping into oscillating MEMS composite transducers. However, that often reduces the amplitude of oscillation near resonance. A preferred approach is to provide an array of MEMS composite transducers having different resonant frequencies, but a relatively low amount of damping. It is preferable for the damping of oscillation of the MEMS composite transducer of the energy harvesting device to be due primarily to conversion of mechanical energy into electrical energy, rather than to include additional sources of mechanical damping. In some embodiments, the damping of oscillations of the MEMS composite transducer in an energy harvesting device is reduced by enclosing the device in a hermetically sealed housing 205 (shown in FIG. 11A) from which air has been removed.

Figure 9:
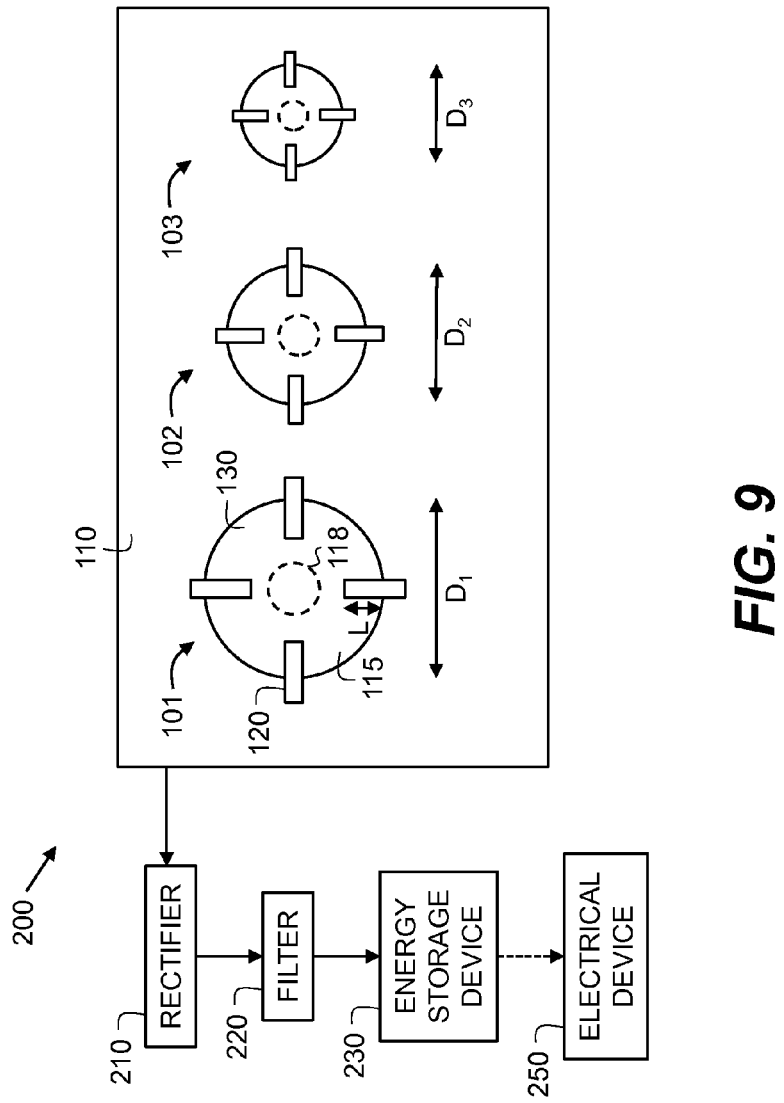
FIG. 9 is a top view of an embodiment of an energy harvesting device including an array MEMS composite transducers having different resonant frequencies and associate circuitry.

FIG. 9 shows a portion of an energy harvesting device 200 including a lower frequency MEMS composite transducer 101, a middle frequency MEMS composite transducer 102 and a higher frequency MEMS composite transducer 103 that are all formed together on a single substrate 110. Each of the MEMS composite transducers is similar in that they include a cavity 115, at least one cantilevered beam 120, a compliant membrane 130, and optionally a mass 118 attached to the compliant membrane 130. Cavities 115 for MEMS composite transducers 101, 102 and 103 have diameters $D_1$, $D_2$ and $D_3$ respectively, where $D_1 > D_2 > D_3$. In other words, lower frequency MEMS composite transducers tend to have a larger diameter of cavity 115. Lower frequency MEMS composite transducers also tend to have a larger mass 118 affixed to compliant membrane 130. In addition, in the example shown in FIG. 9, the length L of cantilevered beam 120 from its anchored first end to its free second end is longer for MEMS composite transducer 101 than it is for MEMS composite transducers 102 or 103. Also shown in FIG. 9 are the rectifier 210, filter 220, and energy storage device 230 that are part of the corresponding energy harvesting apparatus, as well as the electrical energy device 250 that is powered thereby.

Energy harvesting devices 200 are not limited to arrays of MEMS composite transducers having three different resonant frequencies. Depending upon the range of frequencies that are desired to convert to electrical energy in a particular application, an energy harvesting device 200 can include a plurality of MEMS composite transducers having different resonant frequencies, thereby providing a wider range of vibration frequency sensitivity than would an energy harvesting device not including a plurality of MEMS composite transducers having different resonant frequencies.

Figure 10:
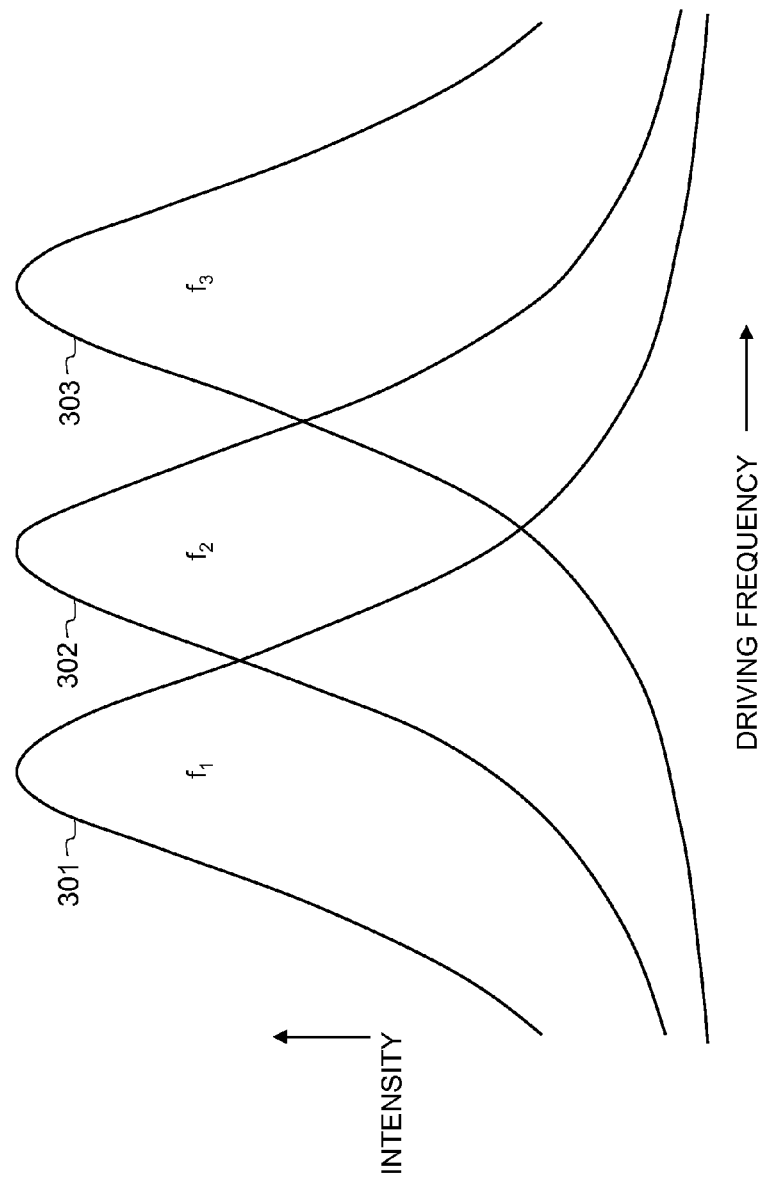
FIG. 10 shows oscillation intensity curves versus driving frequency for an array of MEMS composite transducers having different resonant frequencies.

FIG. 10 schematically shows three intensity curves as a function of driving frequency (where intensity is the square of the amplitude of oscillation) for three different lightly damped MEMS composite transducers, having different resonant frequencies. For example, curve 301 (corresponding to MEMS composite oscillator 101) has a resonance near lower frequency $f_1$, curve 302 (corresponding to MEMS composite oscillator 102) has a resonance near middle frequency $f_2$, and curve 303 (corresponding to MEMS composite oscillator 103) has a resonance near higher frequency $f_2$. The intensity curves 301, 302 and 303 overlap somewhat, so even for excitations that are not at one of the resonant frequencies, a reasonable amount of electrical signal can be generated in the energy harvesting device 200 and used to charge energy storage device 230 or power electrical device 250 (see, for example, FIG. 9).

Figure 12:
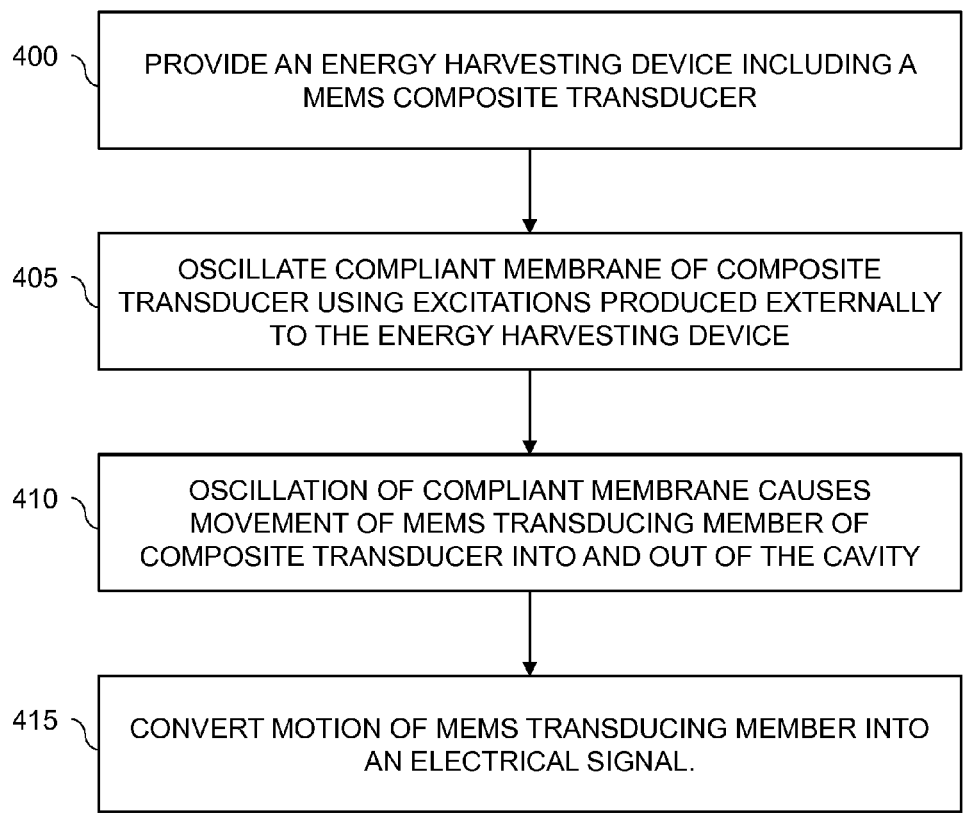
FIG. 12 is a block diagram describing an example embodiment of a method of harvesting energy using a MEMS composite transducer.

Referring to FIG. 12, having described the components of an energy harvesting device and an energy harvesting apparatus, a context is provided for describing a method of harvesting energy from the environment. At least one MEMS composite transducer 100 is provided, step 400, including a substrate 110 having a cavity 115 with at least one cantilevered beam 120 and a compliant membrane 130 in contact with the cantilevered beam 120 and anchored to the substrate. The energy harvesting device is configured so that the compliant membrane 130 is set into oscillation by excitations produced external to the energy harvesting device, step 405. Such excitations could include mechanical vibrations of an object, or pressure waves (including sound waves, or other types of pressure pulses in fluids). The oscillating compliant membrane 130 moves the cantilevered beam 120 into and out of cavity 115, step 410. Because cantilevered beam 120 includes a piezoelectric material, the motion of cantilevered beam is converted into an electrical signal, step 415. More particularly, an AC electrical signal is provided as the cantilevered beam 120 is deflected into and out of cavity 115, thereby alternatingly being put into tension and compression. The AC electrical signal is rectified by rectifier 210, and optionally filtered by filter 220. The rectified signal is typically used to provide a trickle charge to an energy storage device 230, which can be a capacitor or a battery, for example.

Because the power output of an energy harvesting device is typically on the order of microwatts to milliwatts, such an energy harvesting device is particularly well-suited for providing power to electrical devices that require low amounts of energy, or that are intermittently operated. Smoke detectors and camera flashes are examples of devices that are intermittently operated. An energy harvesting device can be used to charge an energy storage device for such an intermittently operated device. Although a relatively high amount of energy is required when the device is operated, use can be infrequent enough so that energy harvesting device can sufficiently charge the energy storage device between operations.

Figure 11A:
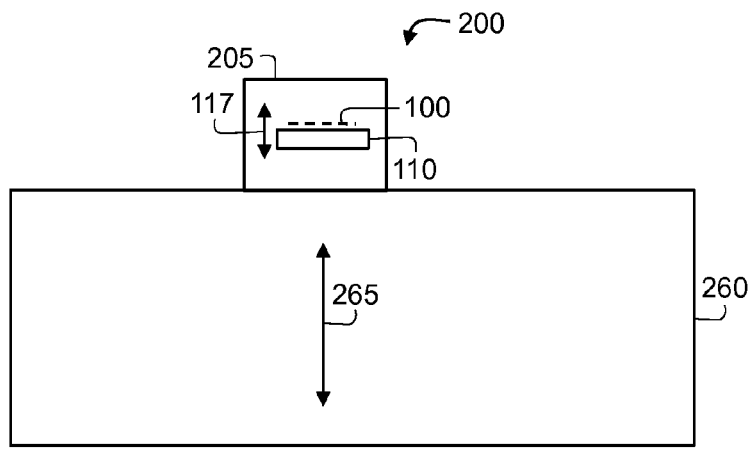
FIG. 11A shows an energy harvesting device affixed to a vibrating object.
Figure 11B:
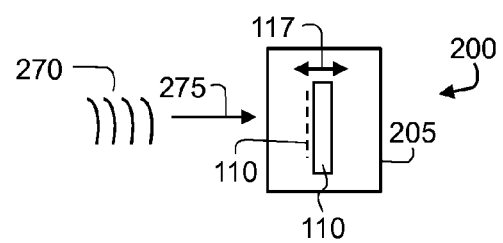
FIG. 11B shows an energy harvesting device oriented toward the propagation direction of pressure waves.

FIG. 11A shows an energy harvesting device 200 including a plurality of MEMS composite transducers 100 of the types described earlier relative to FIGS. 3-9. Axis 117 of cavities 115 is indicated. Mounting member 180 (see FIGS. 7A and 7B) is not shown but can be affixed to housing 205. In some embodiments, housing 205 can be hermetically sealed and a partial vacuum provided within housing 205 for reduction of damping of oscillations of the MEMS composite transducers. Energy harvesting device 200 is in mechanical contact with an object 260 that tends to vibrate. Mechanical contact can be provided by affixing the energy harvesting device 200 to object 260 using adhesives, screws, clamps, or the like. Preferably the energy harvesting device 200 is affixed to the object 260 in a predetermined relative orientation. For example, the predetermined relative orientation can be selected according to a known vibration mode of the object 200 having an axis 265 of vibration that is substantially perpendicular to a plane in which MEMS composite transducer 100 is disposed. Equivalently, it can be said that the predetermined relative orientation can be selected according to a known vibration mode of the object 200 having an axis 265 of vibration that is substantially parallel to axis 117 of cavity 115. FIG. 11B shows an energy harvesting device 200 including a plurality of MEMS composite transducers 100 of the types described earlier relative to FIGS. 3-9. Axis 117 of cavities 115 is indicated. Pressure waves 270 are shown traveling along propagation direction 275 toward energy harvesting device 200. Pressure waves 270 can include sound waves or other sorts of longitudinal waves (also called compression waves) that can be propagated through a gas (such as air) or a liquid (such as water or blood). It is desirable to configure energy harvesting device 200 so that compliant membrane 130 of MEMS composite transducer 100 is set into oscillation by the pressure waves. In particular, it is preferable to orient the energy harvesting device 200 in a predetermined orientation, such that axis 117 of the cavity 115 is oriented along a direction that is substantially parallel to a propagation direction 275 of the pressure waves 270. Other components of the energy harvesting apparatus (rectifier, filter, regulator and energy storage device) are not shown in FIGS. 11A and 11B.

The invention has been described in detail with particular reference to certain preferred embodiments thereof, but it will be understood that variations and modifications can be effected within the scope of the invention.

PARTS LIST

100 MEMS composite transducer
101 Lower frequency MEMS composite transducer
102 Middle frequency MEMS composite transducer
103 Higher frequency MEMS composite transducer
110 Substrate
111 First surface of substrate
112 Second surface of substrate
113 Portions of substrate (defining outer boundary of cavity)
114 Outer boundary
115 Cavity
117 Axis of cavity
116 Through hole (fluid inlet)
118 Mass
120 Cantilevered beam
121 Anchored end (of cantilevered beam)
122 Cantilevered end (of cantilevered beam)
125 Cantilevered beam
130 Compliant membrane
131 Covering portion of compliant membrane
132 Anchoring portion of compliant membrane
133 Portion of compliant membrane overhanging cavity
134 Portion where compliant membrane is removed
160 MEMS transducing material
162 Reference material
180 Mounting member
185 Recess
200 Energy harvesting device
205 Housing
210 Rectifier
220 Filter
230 Energy storage device
250 Electrical device
260 Vibrating object
265 Axis of vibration (of vibrating object)
270 Pressure waves
275 Propagation direction
301 Intensity curve for lower resonant frequency
302 Intensity curve for middle resonant frequency
303 Intensity curve for higher resonant frequency
400 Provide an energy harvesting device including a MEMS composite transducer
405 Oscillate compliant membrane of composite transducer using excitations produced externally to the energy harvesting device
410 Oscillation of compliant membrane causes movement of MEMS transducing member of composite transducer into and out of the cavity
415 Convert motion of MEMS transducing member into an electrical signal.

The invention claimed is:

1. A method of harvesting energy from the environment, the method comprising:
providing an energy harvesting device comprising:
a MEMS composite transducer comprising:
a substrate, portions of the substrate defining an outer boundary of a cavity;
a MEMS transducing member including a beam having a first end and a second end, the first end being anchored to the substrate and the second end being cantilevered over the cavity; and
a compliant membrane positioned in contact with the MEMS transducing member, a first portion of the compliant membrane covering the MEMS transducing member, and a second portion of the compliant membrane being anchored to the substrate;
configuring the energy harvesting device so that the compliant membrane is set into oscillation by excitations produced external to the energy harvesting device;
moving the MEMS transducing member into and out of the cavity by the oscillating compliant membrane; and
converting the motion of the MEMS transducing member into an electrical signal.

2. The method according to claim 1, wherein the electrical signal is an alternating current signal.

3. The method according to claim 2 further comprising rectifying the alternating current signal.

4. The method according to claim 3 further comprising filtering the rectified signal.

5. The method according to claim 3 further comprising using the rectified signal to provide a trickle charge to an energy storing device.

6. The method according to claim 5 further comprising using the energy storing device to provide power to an intermittently operating electrical device.

7. The method according to claim 1, wherein configuring the energy harvesting device further comprises providing mechanical contact between the energy harvesting device and an object.

8. The method according to claim 7, wherein configuring the energy harvesting device further comprises affixing the energy harvesting device to the object in a predetermined relative orientation.

9. The method according to claim 8, the predetermined relative orientation being selected according to a known vibration mode of the object having an axis of vibration that is substantially parallel to an axis of the cavity.

10. The method according to claim 1, wherein configuring the energy harvesting device further comprises configuring the energy harvesting device so that the compliant membrane is set into oscillation by pressure waves.

11. The method according to claim 10, wherein configuring the energy harvesting device further comprises orienting the energy harvesting device in a predetermined orientation.

12. The method according to claim 11, the predetermined orientation being selected such that an axis of the cavity is oriented along a direction that is substantially parallel to a propagation direction of the pressure waves.

13. The method according to claim 1, the MEMS composite transducer being one of a plurality of MEMS composite transducers, a first MEMS composite transducer of the plurality having a different resonant frequency than a second MEMS composite transducer of the plurality.

14. The method according to claim 13, wherein converting the motion of the MEMS transducing member into an electrical signal further comprises converting the motion of the plurality of MEMS composite transducers into electrical signals, the energy harvesting device having a wider range of vibration frequency sensitivity than an energy harvesting device not including a plurality of MEMS composite transducers having different resonant frequencies.

* * * * *